US 12,148,594 B2

(12) United States Patent
Otsuka

(10) Patent No.: US 12,148,594 B2
(45) Date of Patent: Nov. 19, 2024

(54) CHARGED PARTICLE BEAM APPARATUS AND IMAGE ACQUIRING METHOD

(71) Applicant: JEOL Ltd., Tokyo (JP)

(72) Inventor: Takeshi Otsuka, Tokyo (JP)

(73) Assignee: JEOL Ltd., Tokyo (JP)

( * ) Notice: Subject to any disclaimer, the term of this patent is extended or adjusted under 35 U.S.C. 154(b) by 380 days.

(21) Appl. No.: 17/831,144

(22) Filed: Jun. 2, 2022

(65) Prior Publication Data
US 2022/0392738 A1 Dec. 8, 2022

(30) Foreign Application Priority Data

Jun. 3, 2021 (JP) ................................ 2021-093570

(51) Int. Cl.
*H01J 37/22* (2006.01)
*H01J 37/244* (2006.01)
*H01J 37/28* (2006.01)

(52) U.S. Cl.
CPC .......... *H01J 37/222* (2013.01); *H01J 37/244* (2013.01); *H01J 37/28* (2013.01);
(Continued)

(58) Field of Classification Search
CPC ........ H01J 37/222; H01J 37/244; H01J 37/28; H01J 2237/226; H01J 2237/2448;
(Continued)

(56) References Cited

U.S. PATENT DOCUMENTS

2005/0285034 A1* 12/2005 Tanaka .................... H01J 37/28
250/307
2008/0283766 A1 11/2008 Inokuchi
(Continued)

FOREIGN PATENT DOCUMENTS

JP S63215910 A 9/1988
JP S6473209 A 3/1989
(Continued)

OTHER PUBLICATIONS

Office Action issued in JP2021093570 on May 2, 2023.
Extended European Search Report issued in EP22175923.6 on Oct. 31, 2022.

*Primary Examiner* — Kiet T Nguyen
(74) *Attorney, Agent, or Firm* — The Webb Law Firm

(57) ABSTRACT

A charged particle beam apparatus acquires a scanned image by scanning a specimen with a charged particle beam, and detecting charged particles emitted from the specimen. The apparatus includes a charged particle beam source that emits the charged particle beam; an irradiation optical system that scans the specimen with the charged particle beam; a plurality of detection units that detects the charged particles emitted from the specimen; and an image processing unit that reconstructs a profile of a specimen surface of the specimen, based on a plurality of detection signals outputted from the plurality of detection units. The image processing unit: determines an inclination angle of the specimen surface, based on the plurality of detection signals; processing to determine a height of the specimen surface, based on the scanned image; and reconstructs the profile of the specimen surface, based on the inclination angle and the height.

6 Claims, 10 Drawing Sheets

(52) U.S. Cl.
CPC . *H01J 2237/226* (2013.01); *H01J 2237/2448* (2013.01); *H01J 2237/24578* (2013.01); *H01J 2237/2806* (2013.01); *H01J 2237/2814* (2013.01)

(58) Field of Classification Search
CPC ..... H01J 2237/24578; H01J 2237/2806; H01J 2237/2814; H01J 2237/24465
USPC .................................................. 250/306, 307
See application file for complete search history.

(56) References Cited

U.S. PATENT DOCUMENTS

| | | | |
|---|---|---|---|
| 2014/0074419 A1* | 3/2014 | Schwarzband | G01D 18/008 |
| | | | 702/97 |
| 2019/0362934 A1 | 11/2019 | Otsuka | |
| 2022/0207698 A1* | 6/2022 | Zhong | G06V 10/19 |

FOREIGN PATENT DOCUMENTS

| | | |
|---|---|---|
| JP | 2002203507 A | 7/2002 |
| JP | 2008311216 A | 12/2008 |
| JP | 2019204706 A | 11/2019 |

* cited by examiner

| COORDINATE | 1 | 2 | 3 | 4 | 5 | 6 | 7 | 8 | 9 | 10 | 11 | 12 |
|---|---|---|---|---|---|---|---|---|---|---|---|---|
| Z MAP | – | – | – | 10 | – | – | – | – | – | 9.5 | – | – |
| INCLINATION MAP | 0.2 | –0.2 | 0.1 | 0.1 | 0.1 | –0.1 | –0.1 | –0.2 | –0.1 | 0.1 | –0.1 | –0.1 |

| COORDINATE | 1 | 2 | 3 | 4 | 5 | 6 | 7 | 8 | 9 | 10 | 11 | 12 |
|---|---|---|---|---|---|---|---|---|---|---|---|---|
| Z MAP | – | – | – | 10 | – | – | – | – | – | 9.5 | – | – |
| INCLINATION MAP | 0.2 | –0.2 | 0.1 | 0.1 | 0.1 | –0.1 | –0.1 | –0.2 | –0.1 | 0.1 | –0.1 | –0.1 |
| SURFACE PROFILE | | | | 10 | | | | | | 9.5 | | |

| COORDINATE | 1 | 2 | 3 | 4 | 5 | 6 | 7 | 8 | 9 | 10 | 11 | 12 |
|---|---|---|---|---|---|---|---|---|---|---|---|---|
| Z MAP | – | – | – | 10 | – | – | – | – | – | 9.5 | – | – |
| INCLINATION MAP | 0.2 | –0.2 | 0.1 | 0.1 | 0.1 | –0.1 | –0.1 | –0.2 | –0.1 | 0.1 | –0.1 | –0.1 |
| SURFACE PROFILE | | | 9.9 | 10 | 10.1 | | | | 9.6 | 9.5 | 9.4 | |

| COORDINATE | 1 | 2 | 3 | 4 | 5 | 6 | 7 | 8 | 9 | 10 | 11 | 12 |
|---|---|---|---|---|---|---|---|---|---|---|---|---|
| Z MAP | – | – | – | 10 | – | – | – | – | – | 9.5 | – | – |
| INCLINATION MAP | 0.2 | –0.2 | 0.1 | 0.1 | 0.1 | –0.1 | –0.1 | –0.2 | –0.1 | 0.1 | –0.1 | –0.1 |
| SURFACE PROFILE | 9.9 | 10.1 | 9.9 | 10 | 10.1 | 10 | 9.9 | 9.7 | 9.6 | 9.5 | 9.4 | 9.3 |

| COORDINATE | 1 | 2 | 3 | 4 | 5 | 6 | 7 | 8 | 9 | 10 | 11 | 12 |
|---|---|---|---|---|---|---|---|---|---|---|---|---|
| Z MAP | – | – | – | 10 | – | – | – | – | – | 9.5 | – | – |
| INCLINATION MAP | 0.2 | –0.2 | 0.1 | 0.1 | 0.1 | –0.1 | –0.2 | –0.5 | –0.1 | 0.1 | –0.1 | –0.1 |
| SURFACE PROFILE A | 9.9 | 10.1 | 9.9 | 10 | 10.1 | 10 | 9.8 | 9.3 | 9.2 | 9.3 | 9.2 | 9.1 |
| CUMULATIVE ERROR OF A | 0.5 | 0.3 | 0.1 | 0 | 0.1 | 0.2 | 0.3 | 0.5 | 1 | 1.1 | 1.2 | 1.3 |
| SURFACE PROFILE B | 10.2 | 10 | 10.1 | 10.2 | 10.3 | 10.2 | 10 | 9.5 | 9.4 | 9.5 | 9.4 | 9.3 |
| CUMULATIVE ERROR OF B | 1.6 | 1.4 | 1.2 | 1.1 | 1 | 0.9 | 0.8 | 0.6 | 0.1 | 0 | 0.1 | 0.2 |
| SURFACE PROFILE | 9.9 | 10.1 | 9.9 | 10 | 10.1 | 10 | 9.8 | 9.3 | 9.4 | 9.5 | 9.4 | 9.3 |

CHARGED PARTICLE BEAM APPARATUS AND IMAGE ACQUIRING METHOD

CROSS-REFERENCE TO RELATED APPLICATION

This application claims priority to Japanese Patent Application No. 2021-093570 filed Jun. 3, 2021, the disclosure of which is hereby incorporated by reference in its entirety.

BACKGROUND OF THE INVENTION

Field of the Invention

The present invention relates to a charged particle beam apparatus and an image acquiring method.

Description of Related Art

A scanning electron microscope can acquire an SEM image by scanning a surface of a specimen with a finely converged electron beam, and detecting the electrons emitted from the specimen by the radiation of electrons.

Such a scanning electron microscope can acquire information on the inclination angle of a specimen surface using, for example, a divided type detector having a plurality of detection regions. For example, JP-A-2019-204706 discloses a method for reconstructing a three-dimensional structure of a specimen using a divided type detector having four detection regions which are symmetrically disposed with respect to the optical axis.

For example, by detecting electrons independently in each of the four detection regions, four SEM images are acquired, and the inclination angle of the specimen surface can be determined by calculating differences of contrast of the four SEM images at the same coordinates. Further, the profile of the specimen surface can be reconstructed by integrating the inclination angle at each coordinate.

However, in the case of the above mentioned method for determining the inclination angle of the specimen surface, the inclination angle of the specimen surface cannot be accurately determined if the inclination angle is large. This is because as the inclination angle of the specimen surface becomes larger, the change of the signal amount detected in each detection region becomes smaller with respect to the change of the inclination angle. Thus if there is a portion on the specimen surface that has a large inclination angle, in some cases the profile of the specimen surface may not be accurately reconstructed.

SUMMARY OF THE INVENTION

According to a first aspect of the invention, there is provided a charged particle beam apparatus that acquires a scanned image by scanning a specimen with a charged particle beam, and detecting charged particles emitted from the specimen, the apparatus including: a charged particle beam source that emits the charged particle beam; an irradiation optical system that scans the specimen with the charged particle beam; a plurality of detection units that detects the charged particles emitted from the specimen; and an image processing unit that reconstructs a profile of a specimen surface of the specimen, based on a plurality of detection signals outputted from the plurality of detection units, the image processing unit performing: processing to determine an inclination angle of the specimen surface, based on the plurality of detection signals; processing to determine a height of the specimen surface, based on the scanned image; and processing to reconstruct the profile of the specimen surface, based on the inclination angle of the specimen surface and the height of the specimen surface.

According to a second aspect of the invention, there is provided an image acquiring method for a charged particle beam apparatus that includes a charged particle beam source that emits a charged particle beam; an irradiation optical system that scans a specimen with the charged particle beam; and a plurality of detection units that detects charged particles emitted from the specimen, the method including: determining an inclination angle of a specimen surface of the specimen, based on a plurality of detection signals outputted from the plurality of detection units; acquiring a scanned image by scanning the specimen with the charged particle beam and detecting the charged particles emitted from the specimen; determining a height of the specimen surface, based on the scanned image; and reconstructing a profile of the specimen surface, based on the inclination angle of the specimen surface and the height of the specimen surface.

DESCRIPTION OF THE INVENTION

Figure 1:
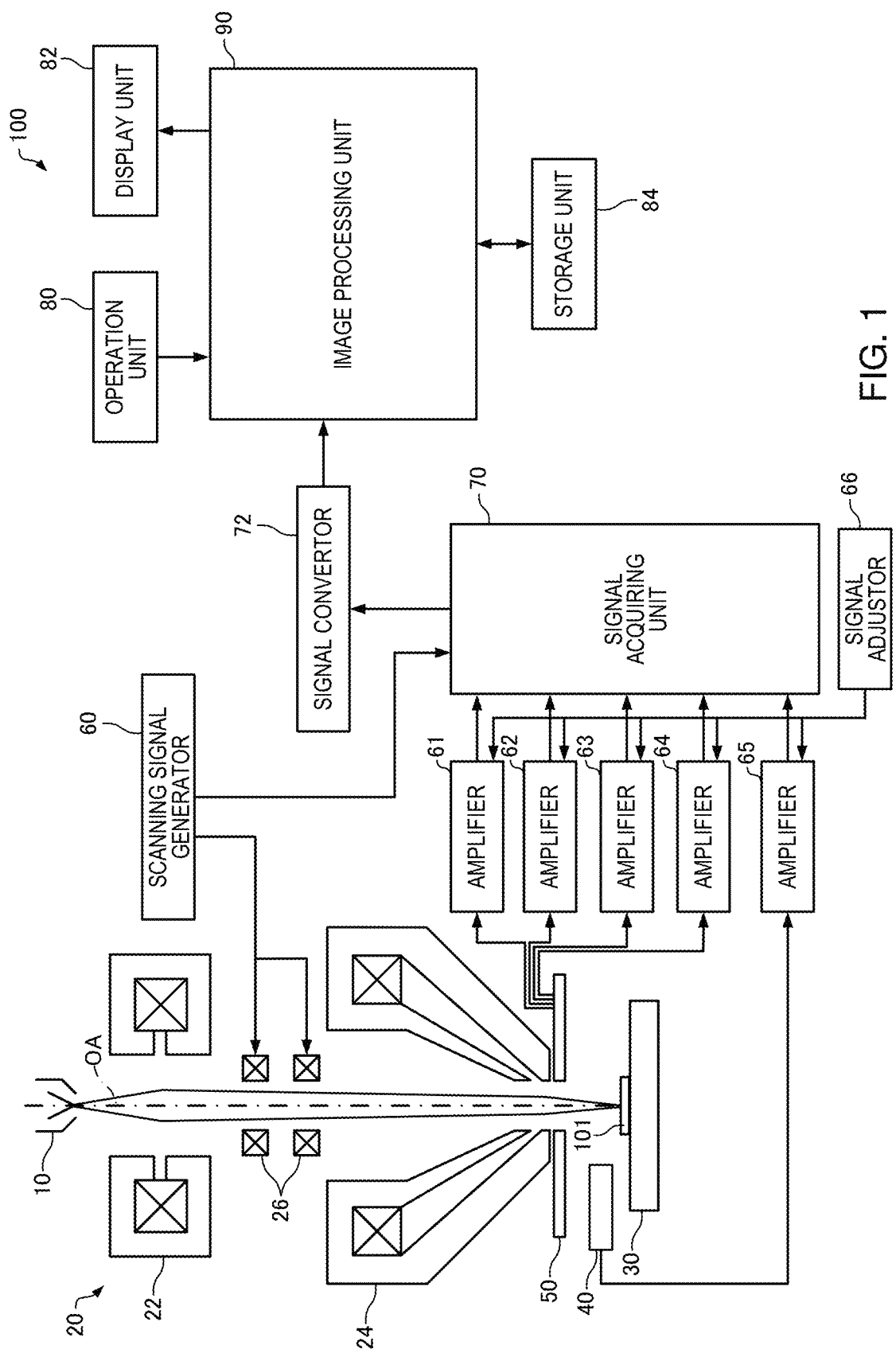
FIG. 1 is a diagram illustrating a configuration of a scanning electron microscope according to an embodiment of the invention.

According to an embodiment of the invention, there is provided a charged particle beam apparatus that acquires a scanned image by scanning a specimen with a charged particle beam, and detecting charged particles emitted from the specimen, the apparatus including:
- a charged particle beam source that emits the charged particle beam;
- an irradiation optical system that scans the specimen with the charged particle beam;
- a plurality of detection units that detects the charged particles emitted from the specimen; and
- an image processing unit that reconstructs a profile of a specimen surface of the specimen, based on a plurality of detection signals outputted from the plurality of detection units, the image processing unit performing:
- processing to determine an inclination angle of the specimen surface, based on the plurality of detection signals;
- processing to determine a height of the specimen surface, based on the scanned image; and
- processing to reconstruct the profile of the specimen surface, based on the inclination angle of the specimen surface and the height of the specimen surface.

According to this charged particle beam apparatus, the profile of the specimen surface can be more accurately reconstructed compared with the case of reconstructing a profile of the specimen surface based only on the inclination angle of the specimen surface, for example.

According to an embodiment of the invention, there is provided an image acquiring method for a charged particle beam apparatus that includes a charged particle beam source that emits a charged particle beam, an irradiation optical system that scans a specimen with the charged particle beam, and a plurality of detection units that detects charged particles emitted from the specimen, the method including:
- determining an inclination angle of a specimen surface of the specimen, based on a plurality of detection signals outputted from the plurality of detection units;
- acquiring a scanned image by scanning the specimen with the charged particle beam and detecting the charged particles emitted from the specimen;
- determining a height of the specimen surface, based on the scanned image; and
- reconstructing a profile of the specimen surface, based on the inclination angle of the specimen surface and the height of the specimen surface.

According to this image acquiring method, the profile of the specimen surface can be more accurately reconstructed compared with the case of reconstructing the profile of the specimen surface based only on the inclination angle of the specimen surface, for example.

Preferred embodiments of the invention are described in detail below with reference to the drawings. It is noted that the following embodiments do not unduly limit the scope of the invention as stated in the claims. In addition, all of the components described in the following embodiments are not necessarily essential requirements of the invention.

In the following, as an example of the charged particle beam apparatus according to the invention, a scanning electron microscope that acquires a scanned image by irradiating a specimen with an electron beam and detecting electrons emitted from the specimen will be described. The charged particle beam apparatus according to the invention may be an apparatus that acquires a scanned image by irradiating a specimen with a charged particle beam other than an electron beam (e.g. ion beam), and detecting charged particles emitted from the specimen.

1. Configuration of Scanning Electron Microscope

A scanning electron microscope according to an embodiment of the invention will be described first, with reference to the drawings. FIG. 1 is a diagram illustrating a configuration of the scanning electron microscope 100 according to an embodiment of the invention.

The scanning electron microscope 100 acquires a scanned image by scanning a surface of a specimen 101 with an electron beam, and detecting electrons emitted from the specimen 101. The scanned image is an image that is acquired by scanning the specimen 101 with a probe of an electron beam or the like, and detecting signals generated from the specimen 101.

As illustrated in FIG. 1, the scanning electron microscope 100 includes an electron source (an example of a charged particle beam source) 10, an irradiation optical system 20, a specimen stage 30, a secondary electron detector 40, a divided type detector 50, a scanning signal generator 60, amplifiers 61, 62, 63, 64 and 65, a signal adjustor 66, a signal acquiring unit 70, a signal convertor 72, an operation unit 80, a display unit 82, a storage unit 84 and an image processing unit 90.

The electron source 10 generates electrons. The electron source 10 is an electron gun that accelerates electrons emitted from a cathode, and emits an electron beam.

The irradiation optical system 20 focuses the electron beam emitted from the electron source 10 and scans the specimen 101 with the focused electron beam. The irradiation optical system 20 includes a converging lens 22, an objective lens 24 and a scanning deflector 26.

The converging lens 22, along with the objective lens 24, converges the electron beam emitted from the electron source 10, and forms an electron probe. The diameter of the electron probe and a probe current (irradiation current amount) can be controlled by the converging lens 22.

The objective lens 24 is a lens to form an electronic probe, and is disposed directly in front of the specimen 101. The objective lens 24 includes a coil and a yoke, for example. In the objective lens 24, a line of magnetic force generated by the coil is confined in the yoke, which is formed by a material having a high magnetic permeability, and the lines of magnetic force distributed at high density are leaked onto the optical axis OA through a notch formed on a part of the yoke.

The scanning deflector 26 deflects the electron probe formed by the converging lens 22 and the objective lens 24. The scanning deflector 26 is used for scanning the specimen 101 with the electron probe. The scanning deflector 26 is driven in accordance with a scanning signal generated by the scanning signal generator 60, so as to deflect the electron beam. As a result, the surface of the specimen 101 can be scanned with the electron probe.

The specimen 101 is placed on the specimen stage 30. The specimen stage 30 supports the specimen 101. The specimen stage 30 has a driving mechanism to move the specimen 101.

The secondary electron detector 40 detects secondary electrons which are emitted from the specimen 101 when the specimen 101 is irradiated with the electron beam. The secondary electron detector 40 outputs the detection signal having signal amounts in accordance with the amount of detected electrons. The secondary electron detector 40 includes a scintillator (fluorescent material) and a photo-multiplier tube, for example. In the secondary electron detector 40, the entered electrons are converted into light by the scintillator. The light is then converted into electrons and amplified by the photo-multiplier tube, and is detected as current.

The divided type detector 50 detects electrons (e.g. backscattered electrons) emitted from the specimen 101 when the specimen 101 is irradiated with the electron beam. The divided type detector 50 is a semiconductor detector, for example. The divided type detector 50 is disposed between the objective lens 24 and the specimen stage 30.

Figure 2:
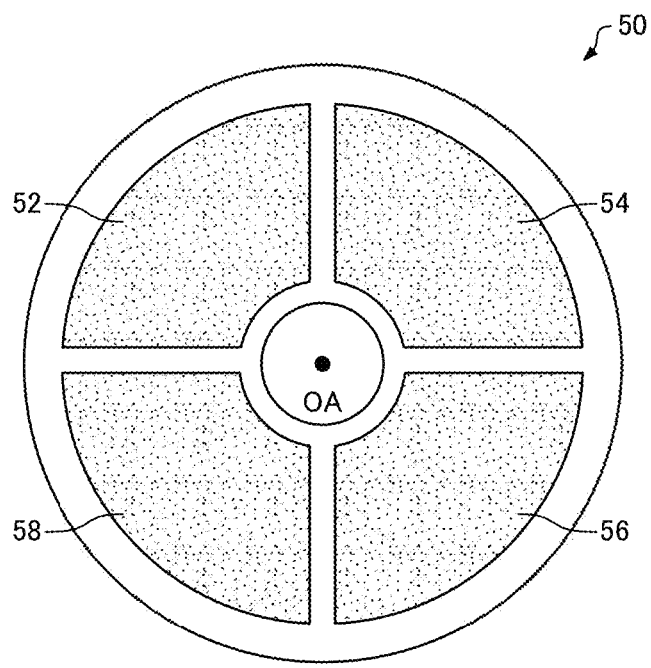
FIG. 2 is a schematic plan view of a divided type detector.

FIG. 2 is a schematic plan view of the divided type detector 50. As illustrated in FIG. 2, the divided type detector 50 has four detection regions (first detection region 52, second detection region 54, third detection region 56 and fourth detection region 58). The four detection regions 52, 54, 56 and 58 can detects electrons independently from each other. In other words, each of the four detection regions 52, 54, 56 and 58 functions as a detection unit that outputs a detection signal having a signal amount in accordance with the amount of the detected electrons. In the divided type detector 50, a first detection signal is outputted from the first detection region 52, a second detection signal is outputted from the second detection region 54, a third detection signal is outputted from the third detection region 56, and a fourth detection signal is detected from the fourth detection region 58.

In the case of the example illustrated in FIG. 2, an annular detection surface is divided in the circumferential direction into four detection regions 52, 54, 56 and 58. A hole to pass an electron beam is formed on the divided type detector 50. Four detection regions 52, 54, 56 and 58 are symmetrically disposed with respect to the optical axis OA on the divided type detector 50. The four detection regions 52, 54, 56 and 58 are disposed on the plane vertical to the optical axis O. In other words, the four detection regions 52, 54, 56 and 58 are symmetrically disposed with respect to the optical axis OA on the plane vertical to the optical axis OA. The area of each of the four detection regions 52, 54, 56 and 58 is the same as each other, for example.

The shape of the detection region and a number of divisions are not limited to the example illustrated in FIG. 2. For example, a number of detection regions may be any number that is at least two. Instead of the divided type detector 50, a plurality of electronic detectors may be disposed in one detection region. In this case, one electronic detector constitutes one detecting unit.

Further, in the case of the example illustrated in FIG. 1, the divided type detector 50 is disposed directly under the objective lens 24, but the position of the divided type detector 50 is not especially limited, as long as the backscattered electrons emitted from the specimen 101 can be detected.

For example, in a case where a lens, of which resolution at low acceleration voltage is improved by actively generating the magnetic field of the lens to the area near the specimen 101 (called a snorkel lens) is used for the objective lens 24 in the scanning electron microscope 100, the divided type detector 50 may be disposed inside the objective lens 24 although this is not illustrated. In this case, electrons emitted from the specimen 101 can more easily reach inside the objective lens 24 through the center hole of the objective lens 24.

In the scanning electron microscope 100, an electron probe is formed by converging the electron beam emitted from the electron source 10 by the converging lens 22 and the objective lens 24 and the surface of the specimen 101 is scanned with the electron probe by deflecting the electron beam by the scanning deflector 26. As a result, electrons (secondary electrons and backscattered electrons) are emitted from the specimen 101. The secondary electrons emitted from the specimen 101 are detected by the secondary electron detector 40, and the backscattered electrons emitted from the specimen 101 are detected by the divided type detector 50.

The secondary electron detection signal outputted from the secondary electron detector 40 is amplified by the amplifier 65. The first detection signal outputted from the first detection region 52 is amplified by the amplifier 61. The second detection signal outputted from the second detection region 54 is amplified by the amplifier 62. The third detection signal outputted from the third detection region 56 is amplified by the amplifier 63. And the fourth detection signal outputted from the fourth detection region 58 is amplified by the amplifier 64. The amplifying factors of the detection signals, the offset amounts and the like in the amplifiers 61, 62, 63, 64 and 65 are adjusted by the signal adjustor 66.

The signal acquiring unit 70 acquires the secondary electron detection signal amplified by the amplifier 65. The signal acquiring unit 70 also acquires the first to fourth detection signals amplified by the amplifiers 61, 62, 63 and 64. Further, the signal acquiring unit 70 receives the scanning signal from the scanning signal generator 60, and acquires the information on the irradiation position of the electron beam on the specimen 101. In the signal acquiring unit 70, the secondary electron detection signal is linked with information on the irradiation position of the electron beam. Further, in the signal acquiring unit 70, the first to fourth detection signals are linked with information on the irradiation position of the electron beam. The signal acquiring unit 70 is implemented by a dedicated circuit, for example.

In the signal convertor 72, the detection signals outputted from the signal acquiring unit 70 are converted into signals, which can be read by the image processing unit 90. The image processing unit 90 generates a SEM image based on the detection signals converted by the signal convertor 72. For example, the image processing unit 90 generates a secondary electron image based on the secondary electron detection signal, and generates the backscattered electron image based on the first to fourth detection signals. The image processing unit 90 generates the SEM image by expressing the irradiation position of the electron beam as coordinates (X, Y), and the signal amount detected at the irradiation position as brightness (luminance). For example, the image processing unit 90 generates the backscattered electron image by calculating the total of the signal amounts of the first to fourth detection signals at each irradiation position, and expressing the total of the signal amounts as brightness. The SEM image includes the secondary electron image and the backscattered electron image.

The operation unit 80 converts the instruction from the user into signals and sends the signals to the image processing unit 90. The operation unit 80 can be implemented by such input devices as buttons, keys, touch panel display and microphone.

The display unit 82 outputs an image generated by the image processing unit 90. The display unit 82 can be implemented by such a display as a liquid crystal display (LCD), for example.

The storage unit 84 stores programs, data and the like for the image processing unit 90 to perform various calculation processing. The storage unit 84 is used as a work area of the image processing unit 90. The storage unit 84 can be implemented by a random access memory (RAM), a read only memory (ROM), a hard disk, and the like, for example.

The image processing unit 90 generates the SEM images, including the secondary electron image and the backscattered electron image, as mentioned above. The image processing unit 90 also determines the inclination angle of the specimen surface based on the first to fourth detection signals. Further, the image processing unit 90 determines the height of the specimen surface based on the SEM images. The image processing unit 90 reconstructs the profile of the specimen surface based on the inclination angle of the specimen surface, and the height of the specimen surface. Details on the processing by the image processing unit 90 will be described later.

The functions of the image processing unit 90 can be implemented by various processors (e.g. central processing unit (CPU)) executing programs. At least a part of the functions of the image processing unit 90 may be implemented by such a dedicated circuit as an ASIC (e.g. gate array).

2. Image Acquiring Method
2.1. Principle

The scanning electron microscope 100 can reconstruct a three-dimensional profile of the specimen 101 using the divided type detector 50. Specifically, four SEM images are acquired using the four detection regions 52, 54, 56 and 58 of the divided type detector 50. Differences of contrast of the four SEM images reflect the inclination angle of the specimen surface 102, hence the inclination angle of the specimen surface 102 can be determined by calculating the differences of the four signal amounts (differences of contrast) at the same coordinates. Therefore an inclination map can be created based on the four SEM images. The height of each position (coordinates) of the inclination map can be determined by integrating the inclination angles of the specimen surface in the inclination map. Thereby the three-dimensional profile of the specimen surface can be reconstructed.

In the case of the above mentioned method of determining the inclination angle of the specimen surface using the divided type detector 50, however, the error in the inclination angle increases when the inclination angle increases. For example, when the inclination angle becomes 70° or more, the error becomes large if this method is used.

Therefore in the image acquiring method according to an embodiment of the invention, the error in the inclination angle is corrected using the information on the height of the specimen surface 102, and then the profile of the specimen surface is reconstructed. The principle of the image acquiring method according to the present embodiment will now be described in detail.

2.1.1. Determining Inclination Angle of Specimen Surface

Figure 3:
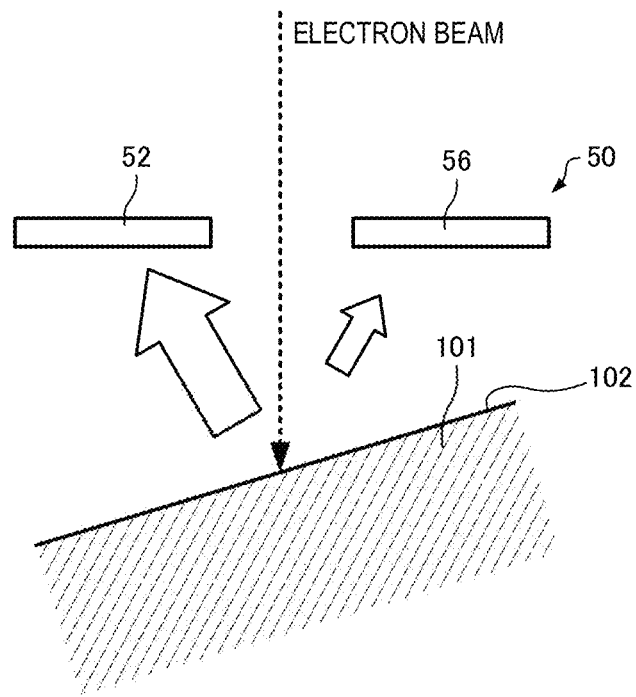
FIG. 3 is a diagram for explaining the relationship of an inclination angle of a specimen surface and signal amounts detected in detection regions.

FIG. 3 is a diagram for describing the relationship of the inclination angle of the specimen surface and the signal amounts detected in the detection regions. Here the relationship of the signal amounts detected in two detection regions disposed at symmetric positions (first detection region 52 and third detection region 56) will be described. In FIG. 3, the amount of electrons emitted from the specimen 101 is indicated by the size of the arrow mark.

As illustrated in FIG. 3, in the case where the specimen surface 102 is inclined, more electrons (scattered electrons) from the specimen 101 are emitted in the inclining direction of the specimen surface 102. Therefore in the example illustrated in FIG. 3, the signal amount of the first detection signal outputted from the first detection region 52, which is located in the position where the specimen surface 102 is inclined, is larger than the signal amount of the third detection signal outputted from the third detection region 56. The difference of the signal amount of the first detection signal and the third detection signal increases as the inclination angle of the specimen surface 102 increases. Therefore based on the difference of the signal amounts, the inclination angle of the specimen surface 102 can be determined.

Figure 4:
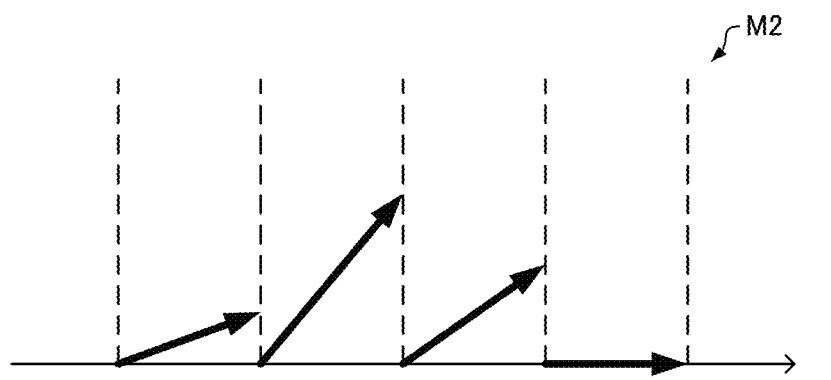
FIG. 4 is a diagram for explaining an inclination map.

FIG. 4 is a diagram for describing the inclination map M2. In FIG. 4, the inclination angle on the specimen surface 102 is indicated by the inclination of the arrow.

While scanning the specimen surface 102 with the electron beam, the electron beam is detected at each irradiation position using the divided type detector 50, and the inclination angle of the specimen surface 102 is calculated based on the difference of the signal amounts of the first detection signal and the third detection signal. Thereby the inclination angle of the specimen surface 102 at each irradiation position can be acquired. As a result, the inclination map M2 in FIG. 4 is created. The inclination map M2 is a map of the inclination angle of the specimen surface 102. In the inclination map M2, the position (coordinate) of the specimen surface 102 and the inclination angle of the specimen surface 102 are corresponded.

Figure 5:
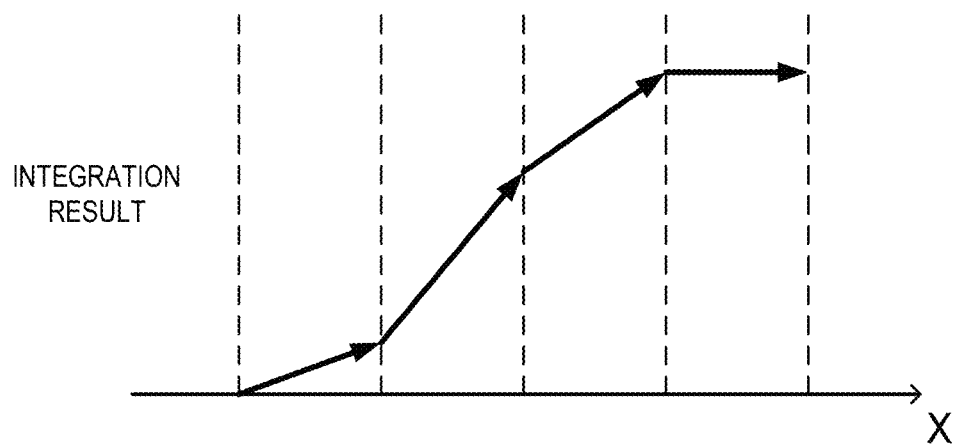
FIG. 5 is a diagram illustrating a profile of a specimen surface determined based on an inclination map.

FIG. 5 is a diagram illustrating the profile of the specimen surface 102 determined based on the inclination map M2.

As illustrated in FIG. 5, the profile of the specimen surface 102 can be determined by integrating the inclination angles of the specimen surface 102 in the inclination map M2.

In the above description, data on the inclination angles of the specimen surface 102 in one direction (X direction) is acquired using the two detection regions, but data on the inclination angles of the specimen surface 102 in two directions (X direction and Y direction) may be acquired using four detection regions in the same manner. Thereby a three-dimensional profile of the specimen surface 102 can be reconstructed.

2.1.2. Determining Height of Specimen Surface

To determine the height of the specimen surface, a plurality of SEM images captured with changing the focal position of the electron beam are analyzed first, then a focused position (focal point position) in each SEM image is determined. For example, clearness of the image is evaluated in each SEM image, and a region where a clear image is acquired in the SEM image, that is, a region where a focal point image which is a focused image, is acquired, is regarded as the focal point position.

The height of the specimen surface can be determined by determining the focal distance of the objective lens 24 (hereafter may also be called "focal distance") at the focal point position. The focal distance is a distance between the principal plane of the objective lens 24 and the focal position of the electron beam. The focal distance can be calculated using the irradiation conditions of the electron beam. The irradiation conditions of the electron beam include the energy of the electron beam (acceleration voltage), and the conditions of the irradiation optical system 20.

For example, a plurality of SEM images captured with changing the focal position of the electron beam are acquired, then the focal distance is calculated based on the irradiation conditions of the electron beam used when each of the SEM images was captured, and the focal point position is determined for each SEM image, whereby the height of the specimen surface can be determined in the plurality of regions on the specimen surface.

Figure 6:
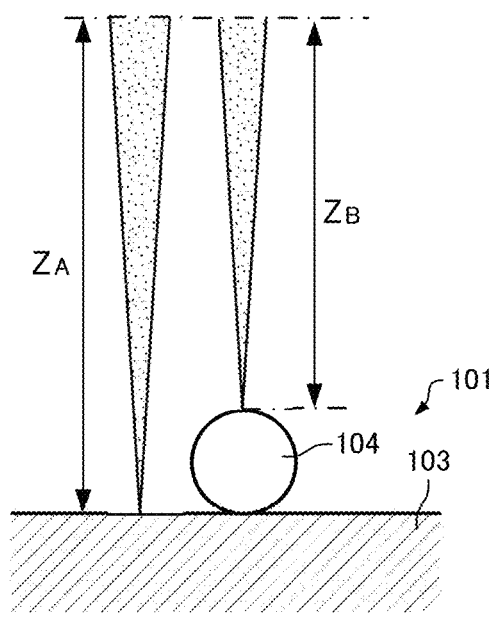
FIG. 6 is a diagram for explaining a method for determining a height of a specimen surface.

FIG. 6 is a diagram for describing the method for determining the height of the specimen surface. FIG. 6 illustrates an example when the specimen 101 is a spherical particle 104 disposed on a substrate 103.

In the case of capturing an SEM image using the electron beam under the irradiation condition $C_A$, the surface of the substrate 103 can be clearly observed in the acquired SEM image. In other words, in this SEM image, the surface of the substrate 103 is focused. By calculating the focal distance $Z_A$ based on the irradiation condition $C_A$, the height of the surface of the substrate 103 can be determined.

In the case of acquiring an SEM image using the electron beam under the irradiation condition $C_B$, an apex of the particle 104 can be clearly observed in the acquired SEM image. In other words, in this SEM image, the apex of the particle 104 is focused. By calculating the focal distance $Z_B$ based on the irradiation condition $C_B$, the height of the apex of the particle 104 can be determined.

Further, by calculating the difference $Z_A - Z_B$ between the focal distance $Z_A$ and the focal distance $Z_B$, the distance between the surface of the substrate 103 and the apex of the particle 104, that is, the height of the particle 104, can be determined.

2.1.3. Reconstructing Profile of Specimen Surface

Figure 7:
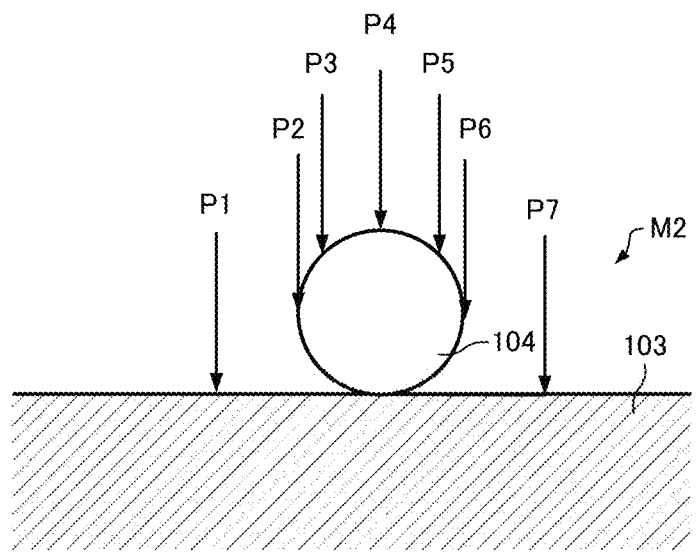
FIG. 7 is a diagram illustrating an inclination map.

FIG. 7 is a diagram illustrating an inclination map M2 of the specimen 101 illustrated in FIG. 6.

In the inclination map M2 in FIG. 7, the inclination angle of the specimen surface at a position P1 is 0°, the inclination angle of the specimen surface at a position P2 is +90°, the inclination angle of the specimen surface at a position P3 is +45°, the inclination angle of the specimen surface at a position P4 is 0°, the inclination angle of the specimen surface at a position P5 is −45°, the inclination angle of the specimen surface at a position P6 is −90°, and the inclination angle of the specimen surface at a position P7 is 0°. The position P1 and the position P7 are located on the substrate 103, the position P2 and the position P6 are located on the side face of the particle 104, and the position P4 is located at the apex of the particle 104. The position P3 is located between the position P2 and the position P4, and the position P5 is located between the position P4 and the position P6.

In this way, the inclination angles become +90° and −90° on the side face of the spherical particle 104.

Figure 8:
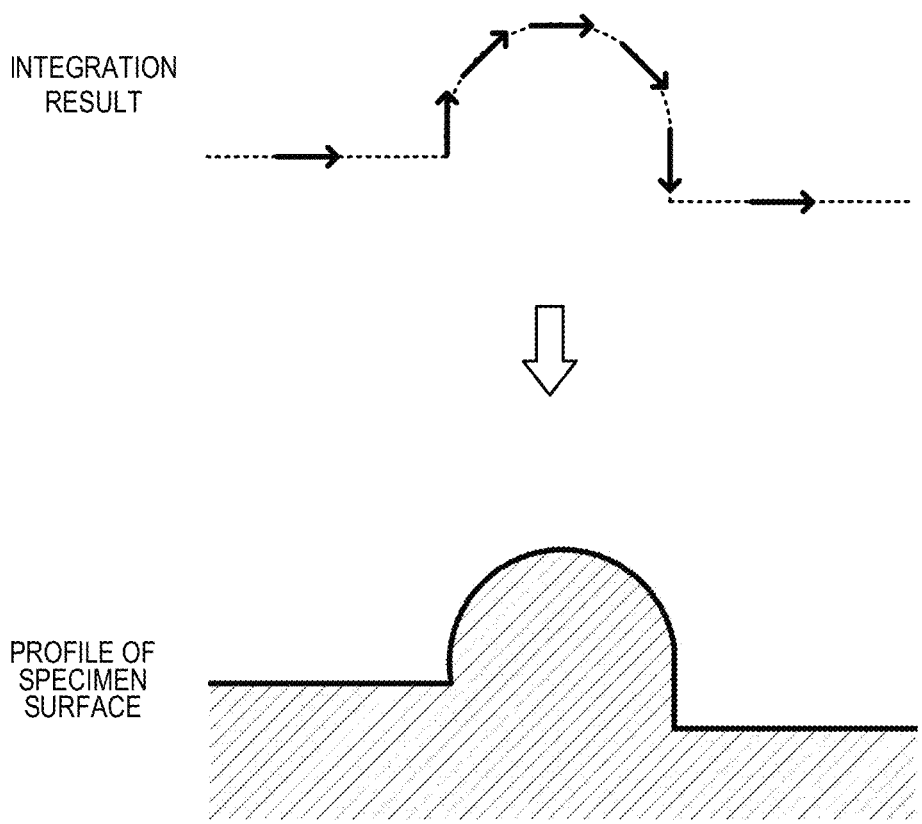
FIG. 8 is a diagram illustrating an example of a result of determining a profile of a specimen surface based on an inclination map.

FIG. 8 is a diagram illustrating an example of the result when the profile of the specimen surface is determined based on the inclination map M2.

As illustrated in FIG. 3, in the case of determining the inclination angle of the specimen surface 102 based on the difference of the signal amounts between the two detection regions 52 and 56, the change of the signal amount of the detection signal with respect to the change of the inclination angle decreases as the inclination angle of the specimen surface increases. Therefore at a location of the specimen surface where the inclination angle is large, an error become large, and the heights of the substrate 103 may become different between the left and right of the particle 104, or the shape of the particle 104 may be deformed, as illustrated in FIG. 8.

When such a problem occurs, the profile of the specimen surface can be more accurately determined if the height of the specimen surface determined in FIG. 6 is used for correction to determine the profile of the specimen surface based on the inclination map M2.

Figure 9:
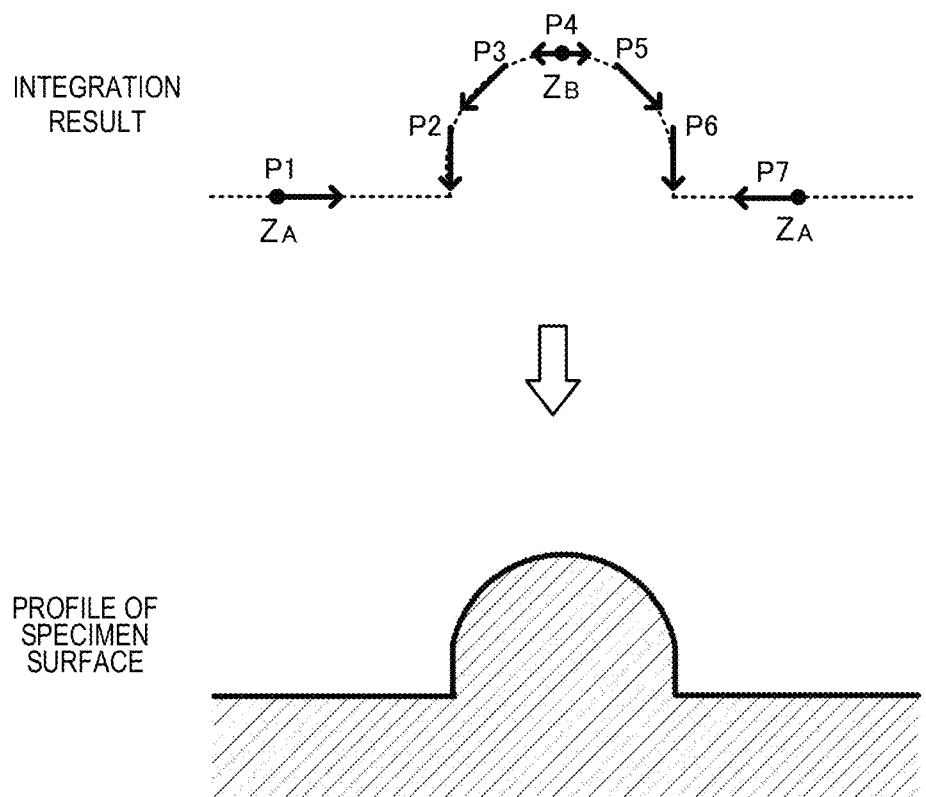
FIG. 9 is a diagram illustrating an example of a result of determining a profile of a specimen surface based on a focal distance $Z_A$, a focal distance $Z_B$ and an inclination map.

FIG. 9 is a diagram illustrating an example of the result when the profile of the specimen surface is determined based on the focal distance $Z_A$, the focal distance $Z_B$, and the inclination map M2.

It is assumed that the focal distance $Z_A$ at the positions P1 and P7 and the focal distance $Z_B$ at the position P4 have been determined. In this case, integration is performed using the position P1, position P7 and position P4 as the start points of integration assumed that the values at position P1 and position P7 are the focal distance $Z_A$ and the value at position P4 is the focal distance $Z_B$. Thereby the profile of the specimen surface can be determined more accurately, as illustrated in FIG. 9.

2.2. Processing by Image Processing Unit 2.2.1. Flow of Processing by Image Processing Unit FIG. 10 is a flow chart illustrating an example of the processing by the image processing unit 90.

Figure 10:
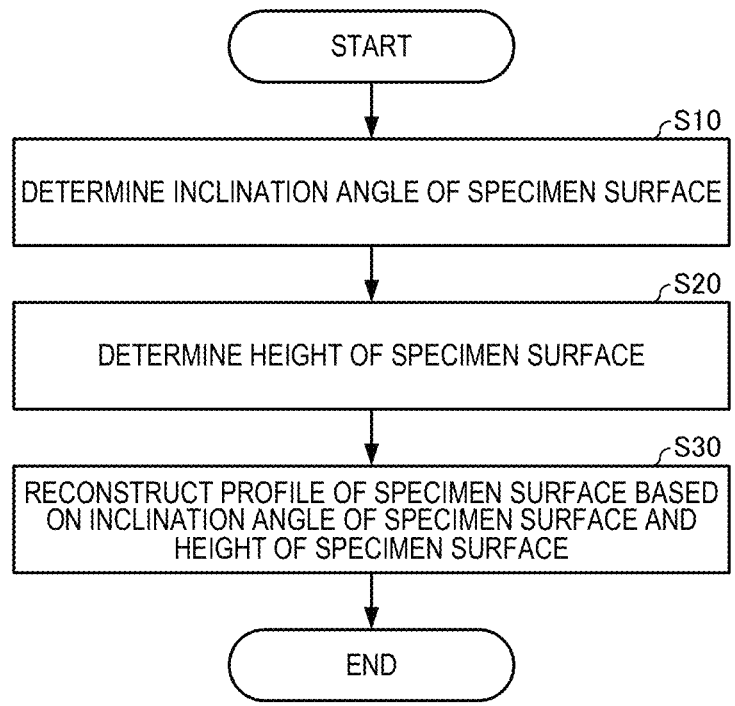
FIG. 10 is a flow chart illustrating an example of processing by an image processing unit.

As illustrated in FIG. 10, the image processing unit 90 performs the processing S10 to determine the inclination angle of the specimen surface based on a plurality of detection signals outputted from the plurality of detection regions 52, 54, 56 and 58, the processing S20 to determine the height of the specimen surface based on the SEM images, and the processing S30 to reconstruct the profile of the specimen surface based on the inclination angle of the specimen surface and the height of the specimen surface. In the case of the example in FIG. 10, the processing S20 to determine the height of the specimen surface is performed after the processing S10 to determine the inclination angle of the specimen surface, but the processing S10 may be performed after the processing S20. Each processing will be described in detail.

2.2.2. Processing S10 to Determine Inclination Angle of Specimen Surface

The image processing unit 90 determines the inclination angle of the specimen surface based on the plurality of detection signals outputted from the plurality of detection regions 52, 54, 56 and 58. As mentioned above, the scanning electron microscope 100 can acquire the first to fourth detection signals by detecting the backscattered electrons at each irradiation position using the divided type detector 50, while scanning the specimen surface 102 with the electron beam. The image processing unit 90 calculates the inclination angle of the specimen surface for each irradiation position, based on the difference of the signal amounts of the first to fourth detection signals. Thereby the inclination map M2 can be acquired.

2.2.3. Processing to Determine Height of Specimen Surface

The image processing unit 90 calculates the height of the specimen surface based on the plurality of SEM images captured at different focal positions.

The height of the specimen surface is determined based on the plurality of SEM images captured at mutually different focal positions. For this, at an arbitrary region in the field-of-view, the focal position is set such that the image can be clearly seen. For this focusing, a known auto focus technique may be used or the user may manually perform focusing. If a focal point is found in an arbitrary region in the field-of-view, in other words, if an image is clearly seen in the arbitrary region in the field-of-view, a SEM image is captured. Then the focal distance is then calculated based on the irradiation conditions of the electron beam at this time. The image processing unit 90 stores the SEM image and the focal distance in the storage unit 84.

Then the image processing unit 90 changes the focal position, captures a SEM image and determines the focal distance in the same manner, then stores the SEM image and the focal distance in the storage unit 84. The focal position is changed by changing the excitation current of the objective lens 24, for example. The focal position may be changed by changing the excitation current of the objective lens 24 by a predetermined amount, or by performing focusing in a region that is different from the region where focusing was performed in a previous image capturing.

By repeating the capturing of a SEM image, the calculation of the focal distance and the change of the focal position like this, the image processing unit 90 acquires a plurality of data on SEM images and focal distances.

The image processing unit 90 creates a Z map based on the plurality of SEM images captured at different focal positions and a focal distance at which each SEM image was captured, as mentioned above.

The Z map is a map indicating the height of the specimen surface 102. In the Z map, the position (coordinates) on the specimen surface 102 and the height of the specimen surface 102 are corresponded. The height of the specimen surface 102 is a value based on the focal distance, for example, and the value of the focal distance may be used as the height of the specimen surface 102. The Z map does not indicate the heights of the entire region of the specimen surface, but indicates the heights of a part of the region of the specimen surface.

Here, the focal distances of all the regions in the field-of-view can be determined if SEM images are acquired with changing the focal position from the lowest position of the specimen to the heights portion of the specimen. However, it takes time to capture many SEM images in a case of a specimen which is high. Further, in a flat region of which composition is uniform, it is difficult to determine a focal point. Hence if a flat region of which composition is uniform exists in the field-of-view, focal distance cannot be determined. This means that it is difficult to determine the heights of the specimen surface in the entire region in the field-of-view. Therefore the Z map does not indicate the heights of the entire region of the specimen surface, but indicates the heights of a part of the region of the specimen surface. The specific method for creating the Z map will now be described.

Figure 11:
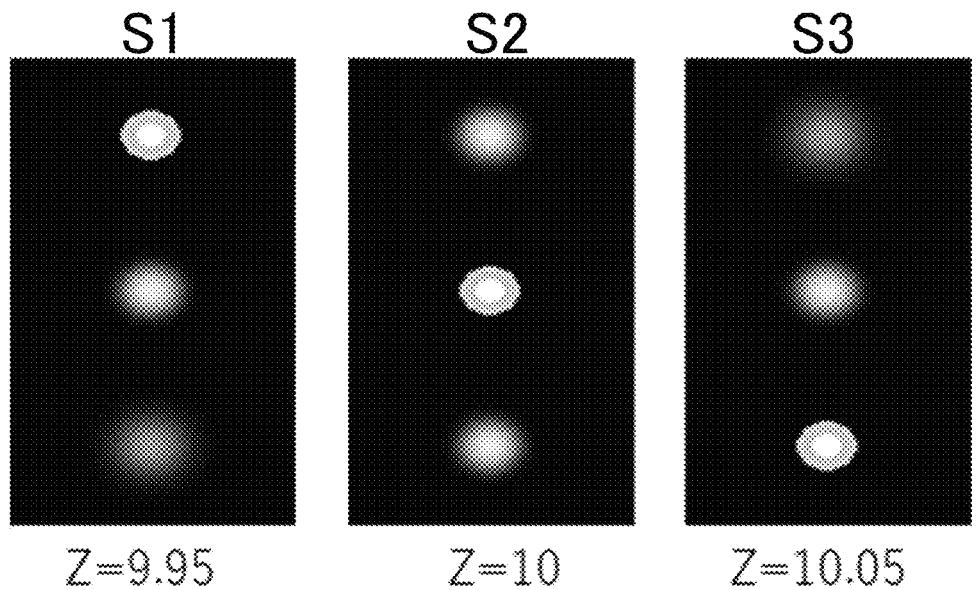
FIG. 11 illustrates three SEM images of which focal positions are different.

FIG. 11 illustrates three SEM images captured at different focal positions. The SEM image S1 is a SEM image captured at focal distance Z=9.95, the SEM image S2 is a SEM image captured at focal distance Z=10, and the SEM image S3 is a SEM image captured at focal distance Z=10.05.

Figure 12:
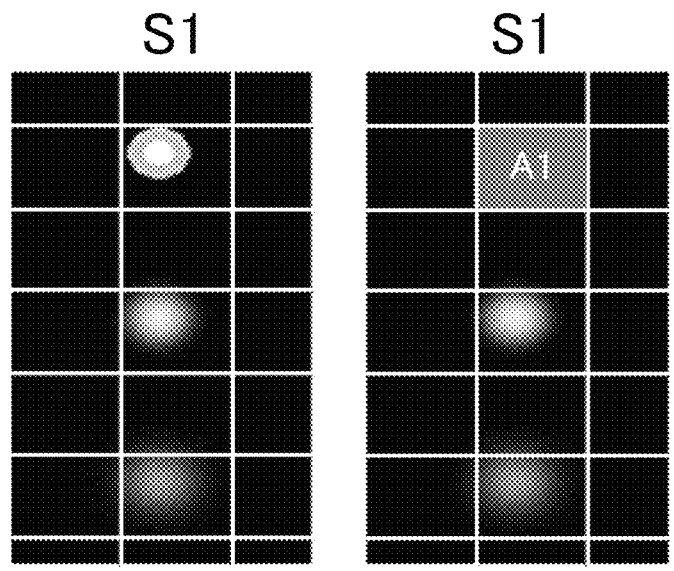
FIG. 12 illustrates images for explaining a method for determining a focal point.

FIG. 12 illustrates images for describing a method for determining a focal point position.

As illustrated in FIG. 12, the SEM image is divided into a plurality of sub-regions, and it is determined if a focused image (focal point image) is acquired in each sub-region. The size of each sub-region can be freely set. Whether the focal point image is acquired in each sub-region or not can be determined, for example, based on the histogram of the brightness in the sub-region.

Figure 13:
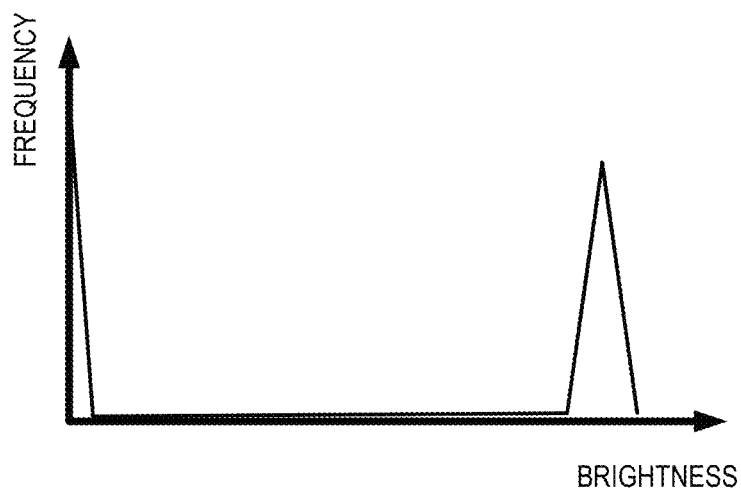
FIG. 13 is a diagram illustrating an example of a histogram in a sub-region.
Figure 14:
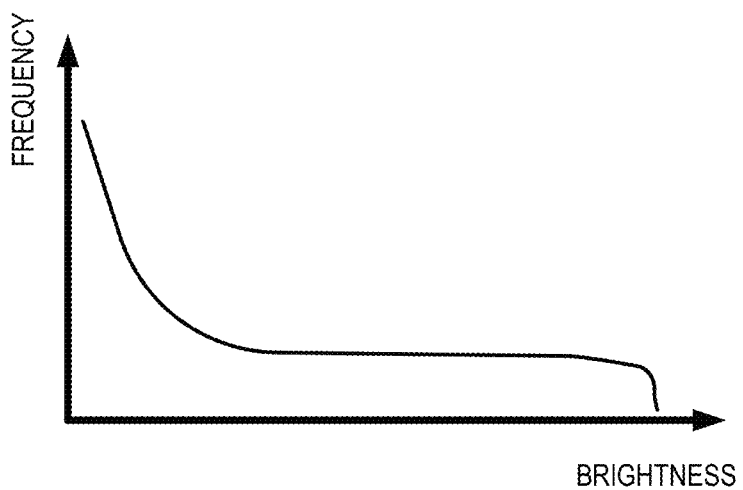
FIG. 14 is a diagram illustrating an example of a histogram in a sub-region.

FIG. 13 and FIG. 14 are diagrams illustrating examples of a histogram in a sub-region. FIG. 13 illustrates a histogram in a sub-region where a focal point image is acquired, and FIG. 14 illustrates a histogram in a sub-region where a focal point image is not acquired.

As illustrated in FIG. 13, a peak is observed in the histogram if a focal point image is acquired in the sub-region. On the other hand, as illustrated in FIG. 14, no clear peak appears in the histogram if a focal point image is not acquired in the sub-region. In this way, the histogram of the brightness in each sub-region is acquired, and it is determined whether the focal point image was acquired in the sub-region or not based on whether a peak is observed in the histogram or not.

The method for determining whether the focal point image is acquired in the sub-region or not is not limited to this method. For example, whether the focal point image is acquired or not may be determined by separating the histogram into frequency components for each sub-region by performing a Fourier transform operation.

In the sub-region A1 of the SEM image S1 in FIG. 12, a peak is observed in the histogram as in the histogram in FIG. 13. Hence it can be determined that a focal point image was acquired in the sub-region A1. Thereby it can be determined that the focal point of the sub-region A1 is at the focal distance Z=9.95.

Figures 15, 16, 17:
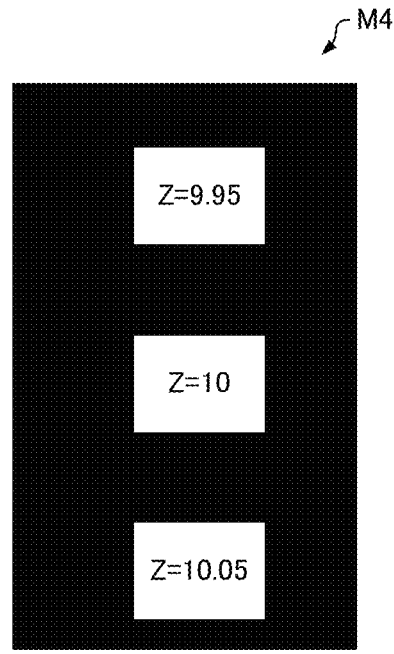
FIG. 15 is a diagram illustrating an example of a Z map.
FIG. 16 is a table illustrating a Z map and an inclination map.
FIG. 17 is a table for explaining a method for reconstructing a surface profile of a specimen.

FIG. 15 is a diagram illustrating an example of the Z map M4.

By repeating the steps of dividing the SEM image into sub-regions, determining whether a focal point image was acquired in each sub-region and calculating the focal distance for each of the SEM image S1, the SEM image S2 and the SEM image S3, the Z map M4 illustrated in FIG. 15 can be created. In the Z map M4, information on the focal distance Z is corresponded to the sub-region which was determined that a focal point image was acquired. In the Z map M4, a sub-region which was determined that a focal point image was not acquired does not have information on the focal distance in all the SEM images.

2.2.4. Reconstructing Profile of Specimen Surface

The image processing unit 90 reconstructs the profile of the specimen surface based on the inclination angle of the specimen surface acquired in processing S10 and the height of the specimen surface acquired in processing S20.

FIG. 16 is a table illustrating the Z map M4 and the inclination map M2. In FIG. 16, the Z map M4 and the inclination map M2 are expressed as one-dimensional data for convenience. In the table in FIG. 16, the coordinate is a coordinate of the SEM image.

In the Z map M4 in FIG. 16, the focal distance Z=10 is acquired at the coordinate X=4, and the focal distance Z=9.5 is acquired at the coordinate X=10. In the Z map M4, the coordinate value is inputted only for the coordinate at which the focal distance Z is acquired, and the coordinate value is not inputted for the coordinate at which the focal distance Z is not acquired. However, a value that indicates the focal distance Z is not acquired (e.g. "4") may be inputted for a coordinate at which the focal distance Z is not acquired.

In the inclination map M2 in FIG. 16, a height difference from the region indicated by the adjacent coordinate on the right side, determined based on the inclination angle of the specimen surface, is inputted for convenience.

Figures 18, 19, 20:
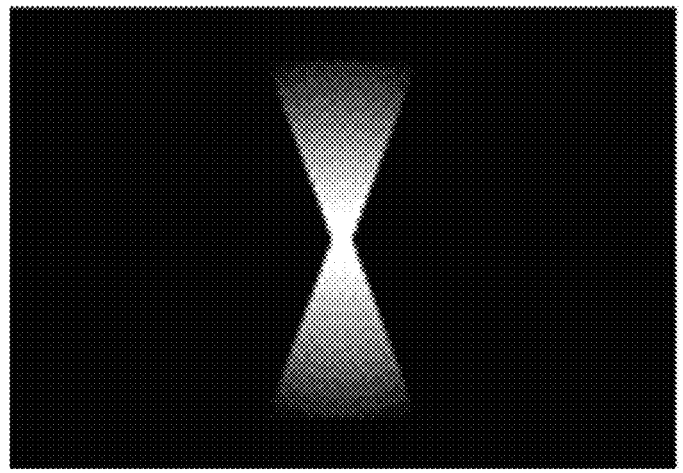
FIG. 18 is a table for explaining a method for reconstructing a surface profile of a specimen.
FIG. 19 is a table for explaining a method for reconstructing a surface profile of a specimen.
FIG. 20 is an X-Z image.

FIG. 17 to FIG. 19 are tables for describing the methods for reconstructing the profile of the specimen surface based on the Z map M4 and the inclination map M2.

First as illustrated in FIG. 17, at the coordinate X=4 and the coordinate X=10 at which focal distance has been acquired, the focal distance of the Z map M4 is used as the surface profile value R (that is, a value indicating the height of the specimen surface). This is because the value acquired in the Z map M4 has higher reliability than the value acquired in the inclination map M2.

Then as illustrated in FIG. 18, at the coordinate X=3 and the coordinate X=5, which are coordinates adjacent to coordinate X=4, the surface profile value R is determined respectively based on the surface profile value R and the inclination angle value of the inclination map M2 at the coordinate X=4. Specifically, at the coordinate X=3, the surface profile value R=9.9 is determined by subtracting the value of the inclination map M2 at the coordinate X=3 from the surface profile value R=10 at the coordinate X=4. In the same manner, at the coordinate X=5, the surface profile value R=10.1 is determined by adding the value of the inclination map M2 at the coordinate X=5 to the surface profile value R=10 at the coordinate X=4.

For the coordinate X=9 and the coordinate X=11, which are coordinates adjacent to the coordinate X=10, as well, the surface profile value R is determined respectively in the same manner.

By repeating the above processing steps, the surface profile value is determined for all the coordinates (pixels) of the SEM image, whereby the profile of the specimen surface can be reconstructed, as illustrated in FIG. 19.

In this description, the Z map M4 and the inclination map M2 have one-dimensional data, but the surface profile can be reconstructed using the same method, even in the case where the Z map M4 and the inclination map M2 have two-dimensional data.

By the above processing, the image processing unit 90 can reconstruct the profile of the specimen surface of the specimen 101.

After processing S30, the image processing unit 90 displays the image of the reconstructed profile of the specimen surface of the specimen 101 on the display unit 82.

3. Effects

In the scanning electron microscope 100, the image processing unit 90 performs the processing to determine the inclination angle of the specimen surface based on a plurality of detection signals, the processing to determine the height of the specimen surface based on the SEM image, and the processing to reconstruct the profile of the specimen surface based on the inclination angle of the specimen surface and the height of the specimen surface. Therefore in the scanning electron microscope 100, the structure of the profile surface can be more accurately reconstructed compared with the case of reconstructing the profile of the specimen surface based only on the inclination angle of the specimen surface, for example.

As mentioned above, in the inclination map M2, an error becomes large as the inclination angle of the specimen surface increases. In the scanning electron microscope 100, this error can be corrected using the height of the specimen surface. Therefore the profile of the specimen surface can be reconstructed more accurately. Further, in the scanning electron microscope 100, the height difference of the specimen surface can be more accurately determined by using the information on the height of the specimen surface.

In the scanning electron microscope 100, the image processing unit 90 determines the height of the specimen surface in a first region of the specimen 101 based on the SEM image in the processing to determine the height of the specimen surface, and determines the height of the specimen surface of a second region, which is adjacent to the first region, based on the height of the specimen surface and the inclination angle of the specimen surface in the first region, in the processing to reconstruct the profile of the specimen surface. Therefore in the scanning electron microscope 100, the profile of the specimen surface can be accurately reconstructed, even if the height of the specimen surface is not determined for all the regions.

In the scanning electron microscope 100, the image processing unit 90, in the processing to determine the height of the specimen surface, divides the SEM image into a plurality of sub-regions, and determines whether a focal point image, which is a focused image, was acquired in each of the plurality of sub-regions, calculates the focal distance at capturing the SEM image based on the irradiation conditions of the electron beam, and determines the height of the specimen surface in the sub-region in which the focused image was acquired based on the calculated focal distance.

Thus in the scanning electron microscope 100, the height of the specimen surface can be determined based on the SEM image.

In the scanning electron microscope 100, the image processing unit 90 performs the processing to acquire the first scanned image and the processing to acquire the second scanned image which was captured at a different focal position of the electron beam from the first scan image, and calculates the height of the specimen surface based on the first scanned image and the second scanned image in the processing to determine the height of the specimen surface. Therefore in the scanning electron microscope 100, the height of the specimen surface can be accurately determined.

In the scanning electron microscope 100, the first scanned image and the second scanned image are secondary electron images. Here the secondary electron detector 40, which detects the secondary electron image, is a detector that includes a scintillator and a photo-multiplier tube. Compared with a semiconductor detector, for example, this detector has a quicker response and can acquire an image in a shorter time. Therefore measurement time can be decreased even in the case of acquiring a plurality of SEM images captured at different focal positions.

The image processing method for the scanning electron microscope 100 includes: a step of determining the inclination angle of the specimen surface based on a plurality of detection signals; a step of determining the height of the specimen surface based on the SEM images; and a step of reconstructing the profile of the specimen surface based on the inclination angle of the specimen surface and the height of the specimen surface. Therefore the profile of the specimen surface can be more accurately reconstructed compared with the case of reconstructing the profile of the specimen surface based on the inclination angle of the specimen surface, for example.

4. Modifications

The invention is not limited to the embodiments described above, but may be modified in various ways within the scope of the spirit of the invention.

4.1. Modification 1

In the above embodiments, whether the focal point image was acquired in each sub-region is determined based on the histogram of the brightness in the sub-region, but the method for determining whether the focal point image was acquired is not limited to this.

For example, in a plurality of SEM images acquired by changing the focal positions at equal intervals, coordinates (X, Y) of each SEM image and XYZ data, which is data on the correspondence of the focal distance Z and the coordinates, are acquired. Then an X-Z image is generated based on the XYZ data.

FIG. 20 illustrates the X-Z image. In the X-Z image in FIG. 20, the horizontal direction indicates the X data, and the vertical direction indicates the Z data.

As illustrated in FIG. 20, the X-Z image has a form of two conical shapes (the apex of each conical shape is at the focal point position) which are vertically connected. This is a shape where a profile of the electron beam near the focal point and the specimen profile are superimposed. Therefore the focal position can be determined by performing deconvolution calculation on the shape of the electron beam near the focal point and the acquired XYZ data.

According to this method, a region in which the focal distance can be determined, is only a region having a structure by which contrast is generated in the SEM image.

Figures 21, 22:
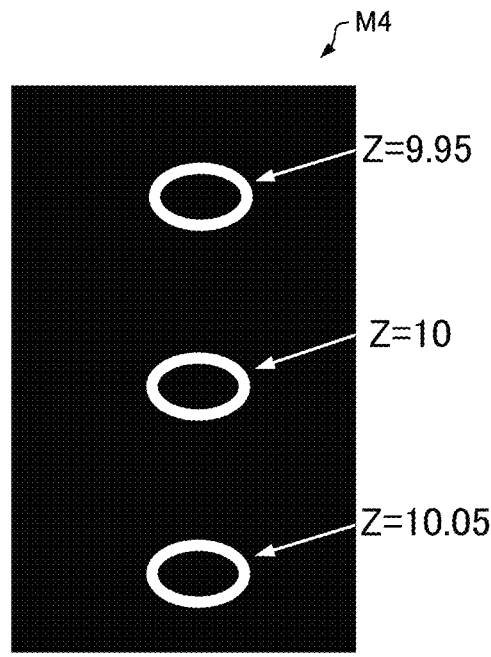
FIG. 21 is a diagram illustrating an example of a Z map.
FIG. 22 is a table for explaining an example of a method for reconstructing a surface profile of a specimen.

FIG. 21 is a diagram illustrating a Z map M4 determined by the deconvolution calculation.

As illustrated in FIG. 21, a region in which the focal position can be determined by the deconvolution calculation is a part of the region of the SEM image, just like the case of determining the focal position based on the histogram.

4.2. Modification 2

In the above mentioned embodiments, as illustrated in FIG. 17 to FIG. 19, the surface profile values are determined using the inclination map M2, setting the coordinate, at which the focal distance Z was acquired in the Z map M4, as the start point.

In the case where the focal distance Z was determined at the plurality of coordinates in the Z map M4, if the surface profile value is determined by setting the coordinate, at which the focal distance Z was determined, as the start point, the surface profile value may be different depending on the start point.

FIG. 22 is a table for describing an example of a method for reconstructing the surface profile of the specimen based on the Z map M4 and the inclination map M2.

As illustrated in FIG. 22, the surface profile values are different, even at the same coordinate, between the surface profile A where the surface profile value was determined with the coordinate X=4 as the start point and the surface profile B where the surface profile value was determined with the coordinate X=10 as the start point.

Here in the inclination map M2, the reliability of the value lowers as the inclination angle of the specimen surface is larger, as mentioned above. Using this, the surface profile is determined based on the table in FIG. 22.

Specifically, the surface profile A is calculated by determining the surface profile value with the coordinate X=4 as the start point, and the surface profile B is calculated by determining the surface profile value with the coordinate X=10 as the start point, as illustrated in FIG. 22. Then the reliability of the surface profile A and the reliability of the surface profile B are evaluated.

To evaluate the reliability, the value of an error is set in accordance with the value of the inclination angle, and the value of the errors that accumulate in the integration steps (hereafter "cumulative error"), when the surface profile is determined, is calculated. Since errors increase as the inclination angle increases, as mentioned above, the value of the error from the inclination angle becomes the absolute value of the value of the inclination map M2.

In the case of the example in FIG. 22, at the coordinate X=4, the value of the Z map M4 is directly used as the surface profile value, hence the cumulative error becomes "0". At the coordinate X=3, the absolute value of the value of the inclination map M2 is added to the cumulative error at the coordinate X=4, hence the cumulative error becomes "0.1". At the coordinate X=2, the absolute value of the value of the inclination map M2 is added to the cumulative error at the coordinate X=3, hence the cumulative error becomes "0.3". By repeating this, the cumulative error at each coordinate is determined.

In the same manner, the cumulative error at each coordinate is determined for the surface profile B as well, which was determined with the coordinate X=10 as the start point.

Here at each coordinate, it is more likely that the actual surface profile is reflected as the cumulative error becomes less. Therefore the cumulative error at each coordinate is compared and the surface profile values of which cumulative error is smaller is regarded as the final surface profile value. In the case of the example in FIG. 22, the value of the surface profile A is used for the coordinates 1 to 8, and the value of the surface profile B is used for the coordinates 9 to 12.

The method for reconstructing the profile of the specimen surface is not limited to the above example. In the above description, a value of which cumulative error is smaller is used for the surface profile value, but the surface profile value may be weighted in accordance with the reliability using the weighted mean, and the average value of the value of the surface profile A and the value of the surface profile B may be used as the surface profile value. The reliability may be evaluated not only for the inclination map M2 but also for the Z map M4, and it may be determined which of the value of the Z map M4 and the value of the inclination map M2 is used.

4.3. Modification 3

In the above mentioned embodiments, the case where the charged particle beam apparatus according to the invention is the scanning electron microscope was described, but the charged particle beam apparatus according to the invention is not limited to the scanning electron microscope. The charged particle beam apparatus according to the invention may be a focused ion beam apparatus, for example, which acquires a scanned image by irradiating a specimen with an ion beam, and detecting electrons emitted from the specimen.

The above mentioned embodiments and modifications are examples, and the invention is not limited to these. For example, each embodiment and each modification may be combined as required.

The invention is not limited to the above-described embodiments, and various modifications can be made. For example, the invention includes configurations that are substantially the same as the configurations described in the embodiments. Substantially same configurations mean configurations having the same functions, methods and results, or configurations having the same objectives and effects as those of the configurations described in the embodiments, for example. The invention also includes configurations obtained by replacing non-essential elements of the configurations described in the embodiments with other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Besides the embodiments of the invention described in detail above, a person skilled in the art will readily appreciate that various modifications can be made from the embodiments without materially departing from the novel teachings and effects of the invention. Accordingly, all such modifications are assumed to be included in the scope of the invention.

What is claimed is:

1. A charged particle beam apparatus that acquires a scanned image by scanning a specimen with a charged particle beam, and detecting charged particles emitted from the specimen, the apparatus comprising:
   a charged particle beam source that emits the charged particle beam;
   an irradiation optical system that scans the specimen with the charged particle beam;
   a plurality of detection units that detects the charged particles emitted from the specimen; and
   an image processing unit that reconstructs a profile of a specimen surface of the specimen, based on a plurality of detection signals outputted from the plurality of detection units, the image processing unit configure to perform:

processing to determine an inclination angle of the specimen surface, based on the plurality of detection signals;

processing to determine a height of the specimen surface, based on the scanned image; and processing to reconstruct the profile of the specimen surface, based on the inclination angle of the specimen surface and the height of the specimen surface, wherein, in the processing to determine the height of the specimen surface, the image processing unit is configured to:

divide the scanned image into a plurality of sub-regions, determine whether a focused image is acquired in each of the plurality of sub-regions, calculate a focal distance when the scanned image has been obtained, based on an irradiation condition of the charged particle beam, and determine the height of the specimen surface in a sub-region where the focused image has been acquired, among the plurality of the sub-regions, based on the calculated focal distance.

2. The charged particle beam apparatus according to claim 1, wherein in the processing to determine the height of the specimen surface, the image processing unit determines a height of the specimen surface in a first region of the specimen, based on the scanned image, and in the processing to reconstruct the profile of the specimen surface, the image processing unit determines a height of the specimen surface in a second region which is adjacent to the first region, based on the height of the specimen surface in the first region and the inclination angle of the specimen surface.

3. The charged particle beam apparatus according to claim 1, wherein the image processing unit is further configured to perform:

processing to acquire a first scanned image; and processing to acquire a second scanned image obtained at a focal position of the charged particle beam which is different from a focal position at which the first scanned image has been obtained, and in the processing to determine the height of the specimen surface, the image processing unit determines the height of the specimen surface, based on the first scanned image and the second scanned image.

4. The charged particle beam apparatus according to claim 1, further comprising:

a secondary electron detector that detects secondary electrons emitted from the specimen, wherein the scanned image is a secondary electron image.

5. The charged particle beam apparatus according to claim 1, wherein the plurality of detection units are symmetrically disposed with respect to an optical axis.

6. An image acquiring method for a charged particle beam apparatus that includes a charged particle beam source that emits a charged particle beam, an irradiation optical system that scans a specimen with the charged particle beam, and a plurality of detection units that detects charged particles emitted from the specimen, the method comprising:

determining an inclination angle of a specimen surface of the specimen, based on a plurality of detection signals outputted from the plurality of detection units;

acquiring a scanned image by scanning the specimen with the charged particle beam and detecting the charged particles emitted from the specimen;

determining a height of the specimen surface, based on the scanned image; and reconstructing a profile of the specimen surface, based on the inclination angle of the specimen surface and the height of the specimen surface, wherein the determining the height of the specimen surface comprises:

dividing the scanned image into a plurality of sub-regions, determining whether a focused image is acquired in each of the plurality of sub-regions, calculating a focal distance when the scanned image has been obtained, based on an irradiation condition of the charged particle beam, and determining the height of the specimen surface in a sub-region where the focused image has been acquired, among the plurality of the sub-regions, based on the calculated focal distance.

* * * * *